(12) United States Patent
Dubbeldam

(10) Patent No.: US 7,276,658 B2
(45) Date of Patent: Oct. 2, 2007

(54) MANUFACTURING A SOLAR CELL FOIL CONNECTED IN SERIES VIA A TEMPORARY SUBSTRATE

(75) Inventor: Gerrit Cornelis Dubbeldam, Zevenaar (NL)

(73) Assignee: Akzo Nobel N.V., Arnhem (NL)

( * ) Notice: Subject to any disclaimer, the term of this patent is extended or adjusted under 35 U.S.C. 154(b) by 219 days.

(21) Appl. No.: 10/479,493

(22) PCT Filed: Jun. 21, 2002

(86) PCT No.: PCT/EP02/07006

§ 371 (c)(1),
(2), (4) Date: Apr. 30, 2004

(87) PCT Pub. No.: WO03/001602

PCT Pub. Date: Jan. 3, 2003

(65) Prior Publication Data

US 2004/0219710 A1 Nov. 4, 2004

(30) Foreign Application Priority Data

Jun. 21, 2001 (NL) .................................... 1018351

(51) Int. Cl.
*H01L 31/0392* (2006.01)
*H01L 31/0236* (2006.01)
(52) U.S. Cl. ...................... 136/256; 136/244; 136/258; 136/261
(58) Field of Classification Search ................ 136/256, 136/244, 258, 261, 251; 257/433, 459, 443; 438/61, 62, 80, 89, 96, 98
See application file for complete search history.

(56) References Cited

U.S. PATENT DOCUMENTS 4,243,432 A 1/1981 Jordan et al.
(Continued)

FOREIGN PATENT DOCUMENTS

EP 0 013 182 A1 7/1980
(Continued)

OTHER PUBLICATIONS

XP-002145686, "New Temporary Superstrate Process for Roll-to-Roll Production of Thin Film Solar Cells", Thin Film Cells and Technologies, Jul. 6-10, 1998, Vienna, Austria, pp. 816-819.
(Continued)

*Primary Examiner*—Nam Nguyen
*Assistant Examiner*—Jeffrey T. Barton
(74) *Attorney, Agent, or Firm*—Oliff & Berridge, PLC

(57) ABSTRACT

The invention pertains to a method of manufacturing a photovoltaic foil provided with solar cells connected in series, which method comprises the following steps: a) providing a temporary substrate b) applying a transparent conductive oxide (TCO) c) applying a photovoltaic (PV) layer on the TCO d) if so desired, applying one or two insulating strips onto the PV layer e) applying a back electrode onto the PV layer and, if they are present, onto the insulating strips f) if so desired, repairing shunts in the back electrode g) providing a groove in the back electrode down to the PV layer, or if it is present, down to an insulating strip h) if so desired, providing a permanent carrier i) removing the temporary substrates j) providing a groove from the side of the side of the TCO through the TCO and, optionally, through the PV layer down to the back electrode, or if it is present, down to an insulating strip if so desired, applying an encapsulant onto the TCO layer, in which process a conductive connection through the PV layer is established (i) between steps f. and h, or (ii) between steps i. And k, or (iii) if one or two insulating strips are applied onto the PV layer in step d, between steps c. and e.

18 Claims, 5 Drawing Sheets

U.S. PATENT DOCUMENTS

| | | | |
|---|---|---|---|
| 4,313,022 A | | 1/1982 | Jordan et al. |
| 4,749,454 A | | 6/1988 | Arya et al. |
| 5,328,519 A | * | 7/1994 | Kawakami ................ 136/244 |
| 5,453,134 A | * | 9/1995 | Arai et al. ................ 136/244 |
| 2001/0037823 A1 | * | 11/2001 | Middelman et al. ........ 136/251 |

FOREIGN PATENT DOCUMENTS

| | | |
|---|---|---|
| EP | 0 320 089 A2 | 6/1989 |
| JP | 2002-100791 A * | 4/2002 |
| WO | WO98/13882 | 4/1998 |
| WO | WO98/13882 A1 * | 4/1998 |
| WO | WO99/49483 | 9/1999 |
| WO | WO 01/47020 A1 | 6/2001 |

OTHER PUBLICATIONS

Joachim Luther et al., "Solar Technology", Ullmann's Encyclopedia of Industrial Chemistry, Jun. 15, 2000, 51 pages.

Fritz Pfisterer, "Photovoltaic Cells", Ullmann's Encyclopedia of Industrial Chemistry, Jun. 15, 2000, 43 pages.

Schropp et al., "Novel Superstrate Process for Textured $SnO^2$,:F/ $p^+$-i-$n^+$ Amorphous Silicon Solar Cells Suitable for Roll-to-Roll-Deposition", $2^{nd}$ World Conference on Exhibition on Photovoltaic Solar Energy Conversion, Jul. 6-10, 1998, Vienna, Austria, pp. 820-822.

* cited by examiner

2a.

2b.

2c.

2d.

MANUFACTURING A SOLAR CELL FOIL CONNECTED IN SERIES VIA A TEMPORARY SUBSTRATE

The invention pertains to a process for manufacturing a solar cell foil with solar cells connected in series, more particularly, a process for manufacturing a solar cell foil with solar cells connected in series which process is suitable for use in the manufacture of flexible solar cell foils via a temporary substrate.

Solar cell foils as a rule comprise a carrier and a photovoltaic layer composed of a semiconductor material provided between a front electrode (at the front of the foil) and a back electrode (on the carrier side of the foil). The front electrode is transparent, enabling incident light to reach the semiconductor material, where the incident radiation is converted into electric energy. In this way light can be used to generate electric power, offering an interesting alternative to, say, fossil fuels or nuclear power.

The maximum voltage of a solar cell is determined by the intensity of the incident light and by the composition of the cell, more particularly, by the nature of the semiconductor material. When the surface area of the solar cell is increased, more power is generated, but the voltage remains the same. In order to increase the voltage, a solar cell foil is often divided into different cells, which are connected in series. This is usually done by providing grooves in the solar cell electrode layers, e.g., by using a laser or by means of etching or any other patterning methods, and establishing a conductive contact between the front electrode of one cell and the back electrode of another. When a solar cell foil is employed, the individual cells are held together by the carrier.

WO 98/13882 discloses a process for manufacturing solar cell foils in which, successively, a front electrode of a transparent conductive oxide (TCO), a photovoltaic (PV) layer, a back electrode, and a carrier are applied onto a temporary substrate, after which the temporary substrate is removed. This publication describes various methods of effecting a connection in series. Thus, for instance, after the application of each layer grooves can be provided in the just applied layer by means of laser scribing or etching. Also mentioned is the possibility of effecting a series connection by providing grooves on either side of the solar cell foil, but no further details are given.

The present invention provides a process for manufacturing a solar cell foil with solar cells connected in series which exploits the opportunity, offered by the use of the temporary substrate, to provide grooves on either side of the solar cell foil.

The process according to the invention comprises the following steps:
a. providing a temporary substrate
b. applying a transparent conductive oxide (TCO)
c. applying a photovoltaic (PV) layer onto the TCO
d. optionally applying one or two insulating strips onto the PV layer
e. applying a back electrode onto the PV layer and, if present, onto the insulating strips
f. optionally repairing shunts in the back electrode
g. providing a groove in the back electrode down to the PV layer or, if present, down to an insulating strip
h. optionally applying a permanent carrier
i. removing the temporary substrate
j. providing a groove from the TCO side through the TCO and, optionally, through the PV layer down to the back electrode or, if present, down to an insulating strip
k. optionally applying an encapsulant onto the TCO layer, in which process a conductive connection through the PV layer is established
(i) between steps f. and h, or
(ii) between steps i. and k, or
(iii) if one or two insulating strips are applied onto the PV layer in step d, between steps c. and e.

It is noted that in the older non-prepublished International application PCT/EP00/13182 a process for manufacturing a solar cell foil with solar cells connected in series is disclosed in which use is made of a temporary substrate. However, this application does not describe the use of insulating strips, nor does it describe the embodiment where the TCO, the PV layer, and the back electrode are applied onto the temporary substrate without a conductive connection being present between the TCO and the back electrode, so as to enable the repair of shunts in the back electrode.

The invention comprises various embodiments. A number of these are elucidated with reference to the figures. The reference to the figures should not be considered as limiting the invention thereto or thereby.

BRIEF DESCRIPTION OF THE DRAWINGS

FIGS. 3a-3d, 4a-4d, and 5a-5d show embodiments in which two insulating strips are applied onto the PV layer.

FIG. 1a shows a solar cell foil comprising a temporary substrate (1) with on top of it a TCO (2), a PV layer (3), and a back electrode (4). In FIG. 1b the foil is provided with a groove (5) through the back electrode down to the PV layer and a conductive connection (6) which connects the back electrode to the TCO. The groove and the connection can be provided simultaneously or sequentially in random order. In FIG. 1c a permanent carrier (7) is applied. The permanent carrier is made of an insulating material and also fills groove (5). The temporary substrate (1) is removed, generally after the permanent carrier has been applied. In FIG. 1d a groove (8) is provided through the TCO down to the PV layer. This completes the connection in series.

FIG. 2a is identical to FIG. 1a and shows a solar cell foil comprising a temporary substrate (1) with on top of it a TCO (2), a PV layer (3), and a back electrode (4). In FIG. 2b the foil is provided with a groove (5) through the back electrode down to the PV layer. In FIG. 2c a permanent carrier (7) is applied. The permanent carrier is made of an insulating material and also fills groove (5). The temporary. substrate (1) has been removed. In FIG. 2d a conductive connection (6) is established which connects the back electrode to the TCO and a groove (8) is provided through the TCO down to the PV layer. The groove and the connection can be provided simultaneously or sequentially in random order. This completes the connection in series.

In FIGS. 1d and 2d the groove (8) runs through the TCO down to the PV layer. It is possible for this groove to carry on down to the back electrode, provided care is taken to ensure that the back electrode is not cut through.

FIG. 3a shows a solar cell foil comprising a temporary substrate (1) with on top of it a TCO (2), a PV layer (3), and a back electrode (4). Also, two insulating strips (9) are applied. In FIG. 3b the foil is provided with a groove (5) through the back electrode down to one insulating strip, as well as with a conductive connection (6) which connects the back electrode to the TCO. The groove and the connection can be provided simultaneously or sequentially in random order. In FIG. 3c a permanent carrier (7) is applied. The permanent carrier is made of an insulating material and also fills the groove (5). The temporary substrate (1) has been removed. In FIG. 4d a groove (8) is provided through the TCO and the PV layer down to the other insulating strip. This completes the connection in series.

FIG. 4a is identical to FIG. 3a and shows a solar cell foil comprising a temporary substrate (1) with on top of it a TCO (2), a PV layer (3), and a back electrode. (4). Also, two insulating strips (9) are applied. In FIG. 4b the foil is provided with a groove (5) through the back electrode down to one insulating strip. In FIG. 4c a permanent carrier (7) is applied. The permanent carrier is made of an insulating material and also fills the groove (5). The temporary substrate (1) has been removed. In FIG. 4d a conductive connection (6) is established which connects the back electrode to the TCO and a groove (8) is provided through the TCO and the PV layer down to the other insulating strip. The groove and the connection can be provided simultaneously or sequentially in random order. This completes the connection in series.

FIG. 5a shows a solar cell foil comprising a temporary substrate (1) with on top of it a TCO (2) and a PV layer (3). Also, two insulating strips (9) are applied, as well as a groove (6) which is to provide the conductive contact between the TCO layer and the back electrode still to be applied. This can be done in any sequence. In FIG. 5b a back electrode (4) is applied over the PV layer and the insulating strips (9). The back electrode material also fills the groove (6) to form a conductive connection. The foil is provided with a groove (5) through the back electrode down to one insulating strip. In FIG. 5c a permanent carrier (7) is applied. The permanent carrier is made of an insulating material and also fills the groove (5). The temporary substrate has been removed. In FIG. 5d a groove (8) is provided through the TCO and the PV layer down to the other insulating strip. This completes the connection in series.

Figure 1:
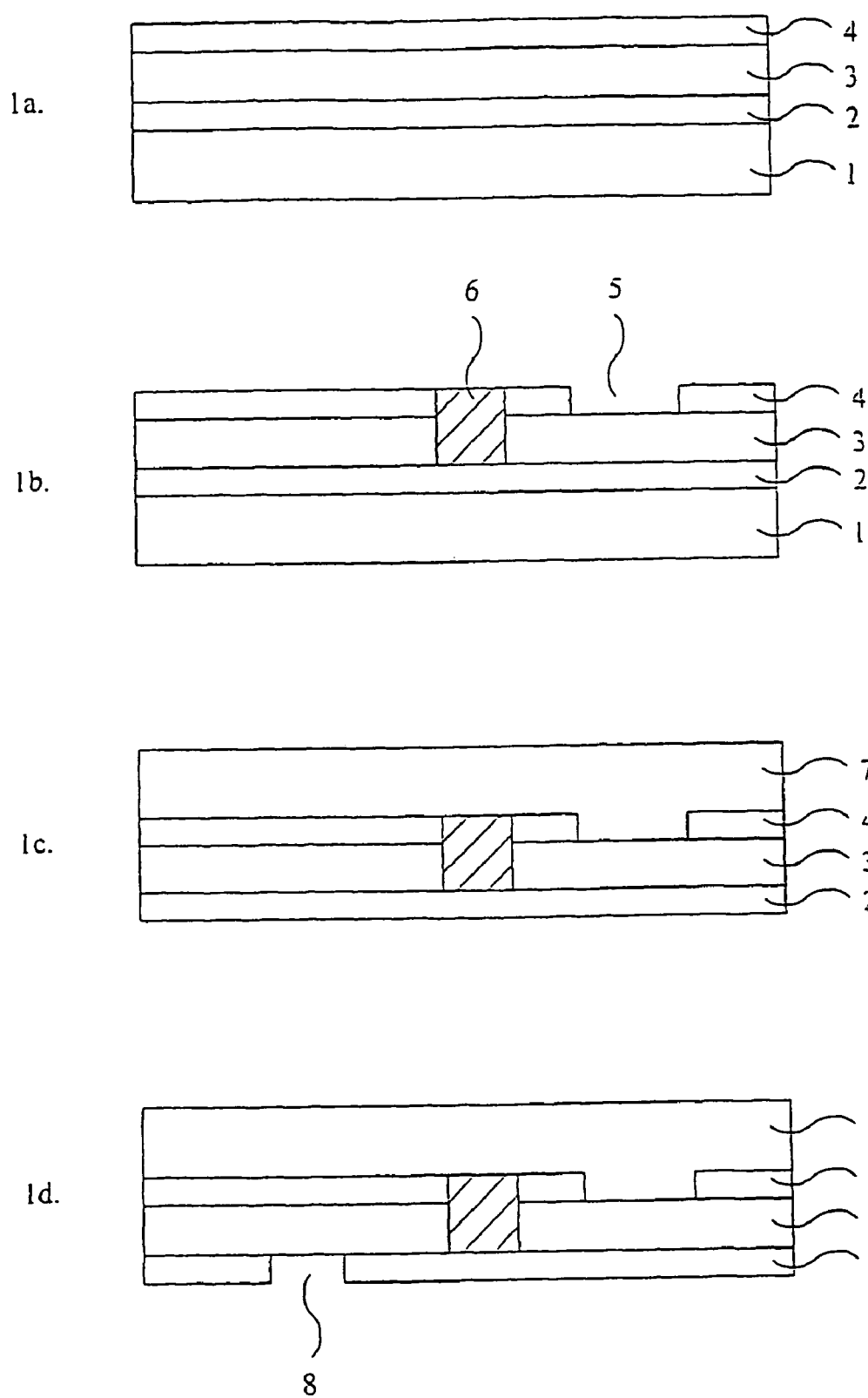
FIGS. 1a-1d and 2a-2d relate to embodiments where there is no application of insulating strips onto the PV layer.
Figure 2:
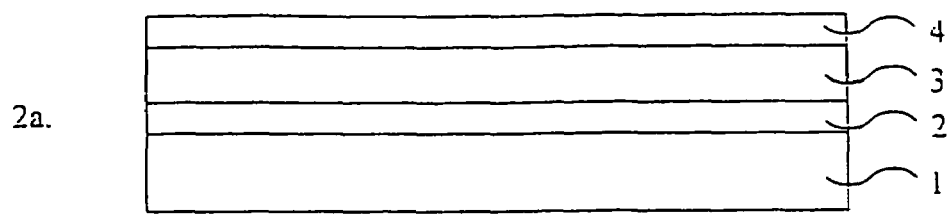
Figure 2:
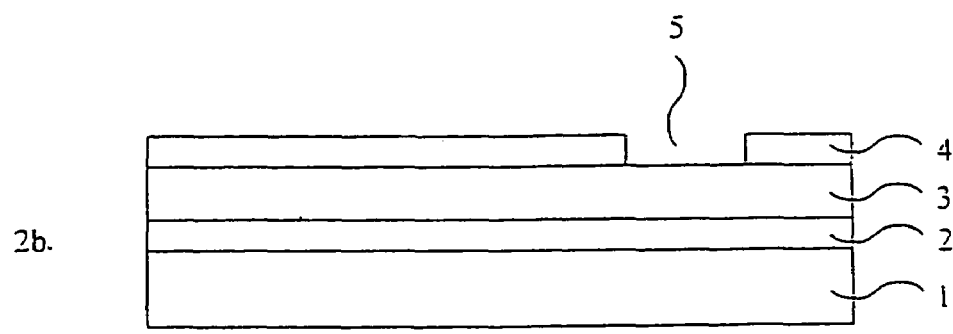
Figure 2:
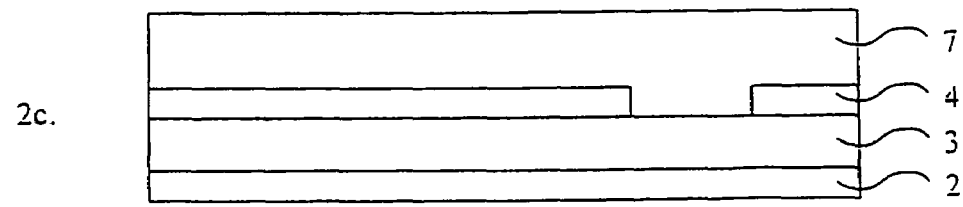
Figure 2:
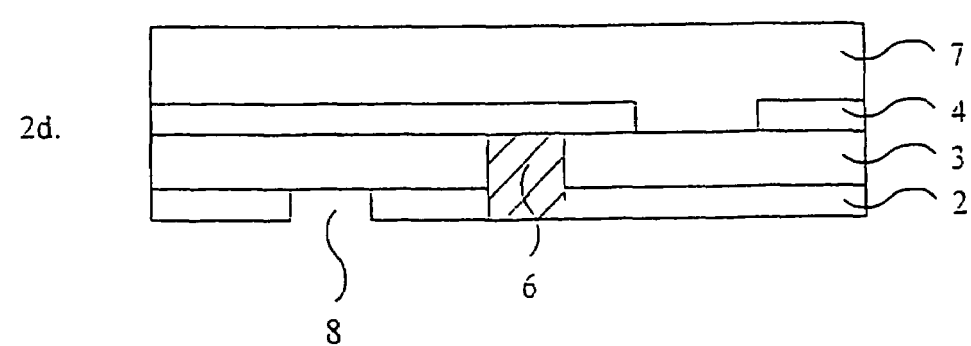
Figure 3:
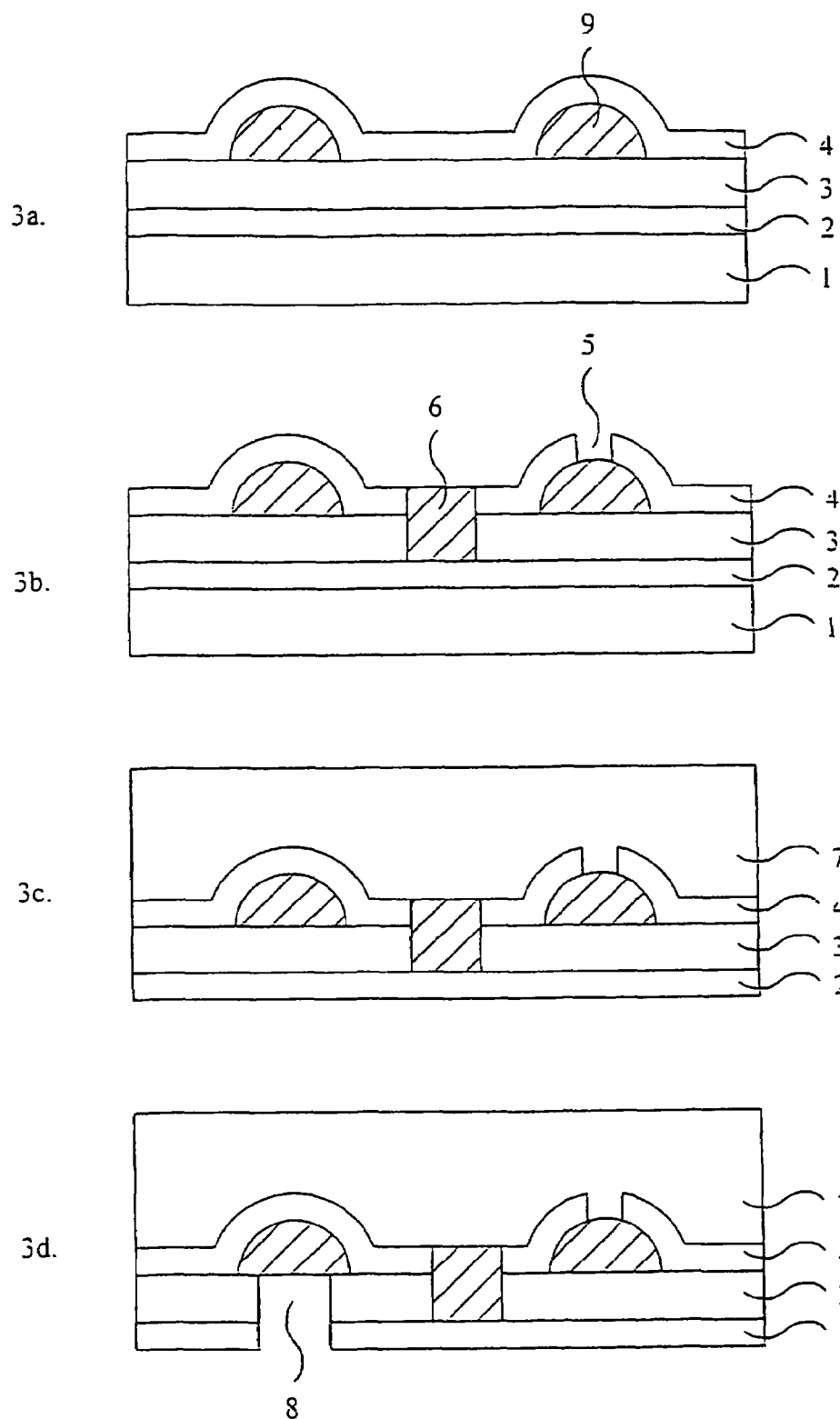
FIGS. 3, 4, and 5 show embodiments in which two insulating strips are applied onto the PV layer. These insulating strips serve as a laser stop. Their presence facilitates the provision of the various grooves, since it reduces the risk of slipping into the underlying layers. Therefore, the embodiments with at least one insulating strip are preferred over those in which no insulating strips are applied. It is possible in principle to apply just one insulating strip, but in actual practice, when the effort is made to apply insulating strips, as a rule two strips are applied.
Figure 4:
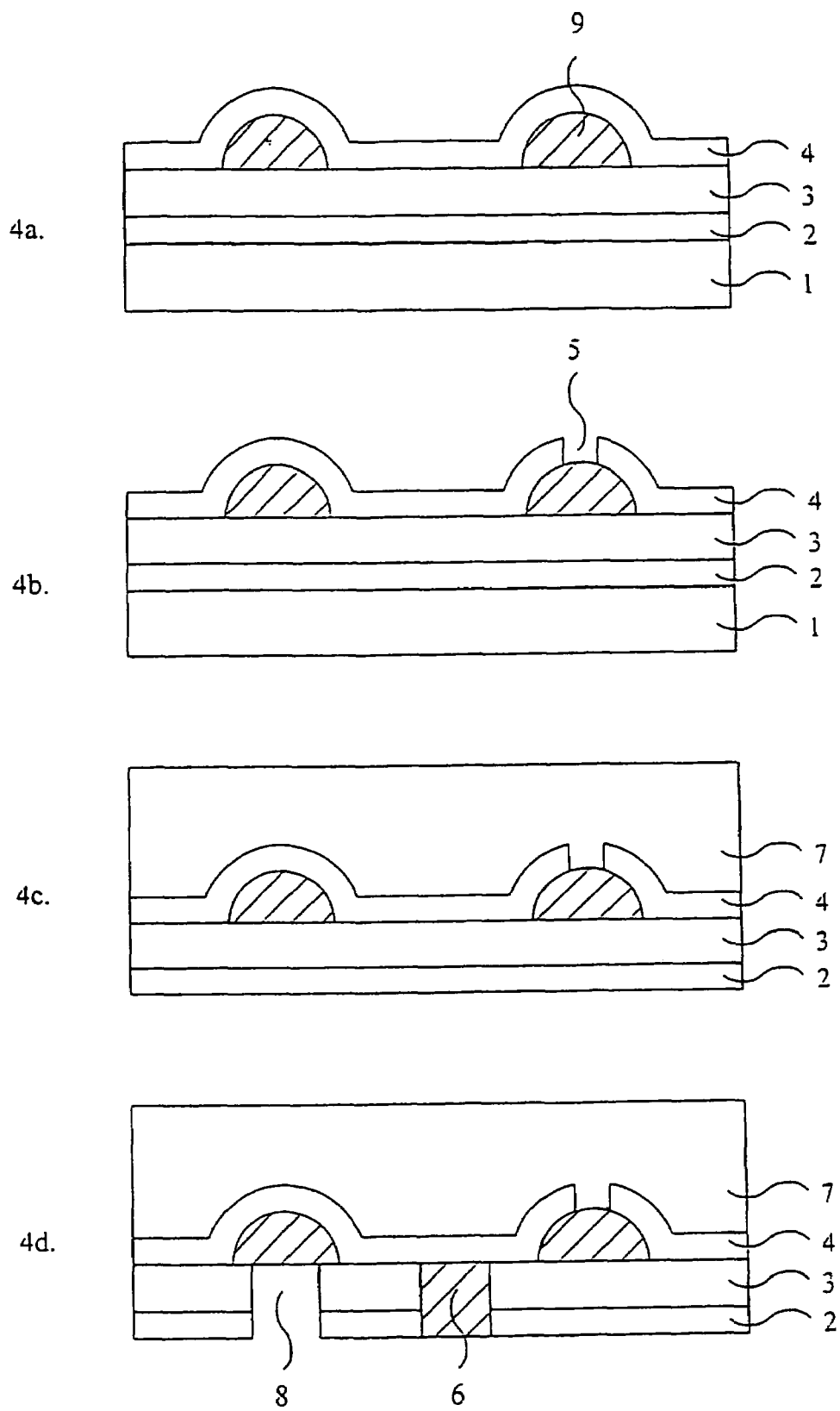
Figure 5:
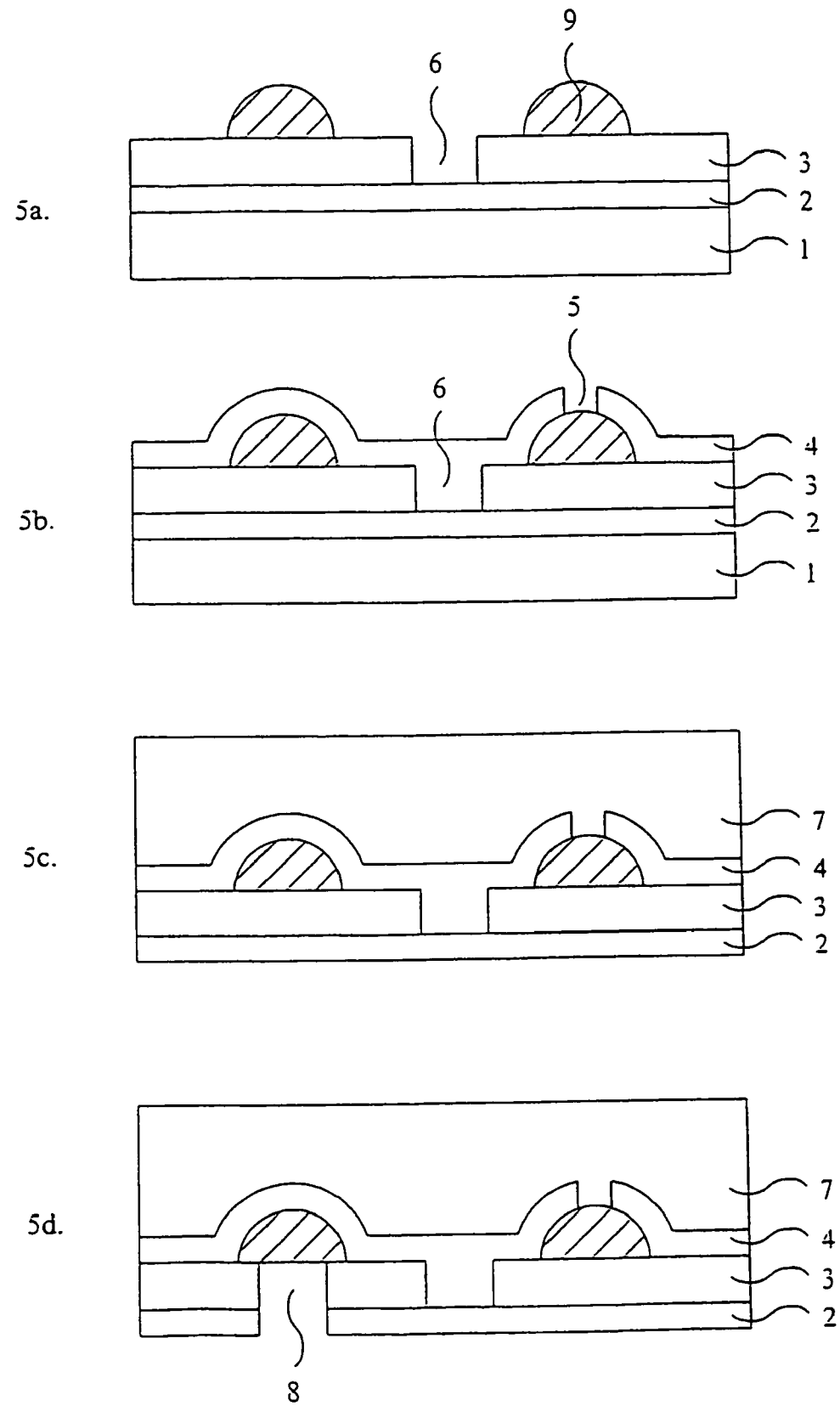

The embodiment of FIG. 5, where once the back electrode has been applied there is a conductive connection between the back electrode and the TCO via conductive connection (6), has the drawback that it is not possible to repair shunts in the back electrode. This embodiment thus is less preferred than the embodiments where first the structure of temporary substrate, TCO, PV layer, optional insulating strips, and back electrode is assembled, as illustrated in FIGS. 1-4, and only then grooves are provided.

The conductive connection (6) between the TCO layer and the back electrode can be established in various ways, depending on whether at the time of establishment the back electrode is already present.

If the back electrode is already present at the time the connection (6) is established, as is preferred in the process of the invention, and as is illustrated in FIGS. 1-4, the following options present themselves. If in this embodiment the PV layer is an amorphous Si layer, the conductive connection can be established by fusing the back electrode and the amorphous Si layer using a laser. This can be done from the back electrode side of the solar cell unit, but also from the TCO side. Alternatively, it is possible in this embodiment to first scribe a groove, either from the back electrode side of the solar cell unit or from the TCO side, and establish or improve the connection by filling the groove with a conductive material, but this option is less preferred.

If the back electrode is not yet present at the time the conductive connection is established, e.g., as in the embodiment of FIG. 5, various options present themselves. In this case it is preferred, as illustrated in FIG. (5), to provide a groove in the PV layer which is filled with back electrode material when the back electrode is applied. Alternatively, although such a process is less preferred at the moment in this embodiment, the groove can be filled with a conductive material in a separate step. Finally, if in this embodiment the PV layer is an amorphous Si layer, a conductive connection can also be established by crystallising it into the amorphous Si. This last option is least preferred for this embodiment.

The grooves can be provided in a known manner with the aid of a laser. If so desired, etching techniques may be employed, but as a rule these are less preferred.

The width of the various grooves generally is determined by the following considerations. At the sites of the grooves, the solar cell is unable to convert light into electricity. In view of this, the grooves have to be as narrow as possible. On the other hand, the grooves have to be wide enough to ensure that the desired effect, the interruption of the different layers and the connection of the front and the back electrode with sufficient conductivity, is attained. The groove (5) generally has a width of 2 to 200 μm, preferably of 5 to 75 μm. The groove (8) generally has a width of 2 to 200 μm, preferably of 5 to 75 μm. Conductive connection (6) generally has a width of 20 to 200 μm, preferably of 50 to 150 μm.

The insulating strips (9) should be wide enough to allow for easy provision of the grooves (6) and (8) within the width of the strips. In general, the strips have a width between 25 and 1,000 μm, preferably between 50 and 200 μm.

The grooves in the front and back electrodes generally are continuous grooves, since the objective is to achieve proper insulation of the various cell strips. The groove in which the conductive connection (6) is present, on the, other hand, does not need to be continuous. This connection serves to establish contact between the back electrode of one cell and the TCO of another cell and, if so desired, may have a discontinuous form, taking the form of holes, stripes, or pits. For reasons of operational efficiency a continuous embodiment may be preferred.

The repair of shunts can be carried out in a manner known-to the skilled person, e.g., as described in U.S. Pat. No. 4,749,454.

The invention is especially suited to be integrated into a continuous process for manufacturing solar cell units, more particularly, into a roll-to-roll process for manufacturing flexible solar cell units, e.g., as disclosed in WO 98/13882 or WO 99/49483. These publications are incorporated by reference into the present description as regards the process for manufacturing the flexible solar cell units and the materials used in said process.

The Temporary Substrate

The temporary substrate has to meet a number of requirements. It has to be sufficiently heat-resistant to withstand the conditions prevailing during the manufacture of the solar cell foil, more particularly, during the deposition of the TCO and the PV layer. It has to be strong enough to support the solar cell foil during its manufacture. It must be easily removable from the TCO layer without the latter being damaged in the process. Within the framework of these guidelines the skilled person will be able to select a suitable temporary substrate.

The temporary substrate may be a polymer. For example, it may be a "positive photoresist," i.e., a light-sensitive material which can be extracted with a solvent under the influence of radiation, e.g., cross-linked polyimides. Since these materials are expensive, their use is not preferred. In this connection it is more attractive to employ polymers which can be removed by means of plasma etching, e.g., by $O_2$ plasma or, in the case of, say, polysiloxane polymers, $SF_6$ plasma. Although virtually all polymers are suitable for use in that case, polymers which are resistant to high temperatures (above 250° C. and more preferably above 400° C.) are preferred.

The temporary substrate used in the process according to the invention preferably is a foil of a metal or metal alloy. The main reasons for this are that in general such foils are resistant to high process temperatures, are slow to evaporate, and can be removed comparatively easily using known etching techniques. Another reason for selecting a metal foil, more particularly an aluminum or copper foil, is that in the end the solar cell foil has to be provided with edge electrodes which have to connect the solar cell foil to an apparatus or the electricity grid. Pieces of unremoved temporary substrate may be used to this end, as a result of which there is no need for separate provision of the edge electrodes.

Suitable metals include steel, aluminum, copper, iron, nickel, silver, zinc, molybdenum, and alloys or multi-layers thereof. For economic reasons among others it is preferred to employ Fe, Al, Cu, or alloys thereof. Given their performance (and taking into account the matter of cost) aluminum, iron made by electrodeposition, and copper made by electrodeposition are most preferred. Suitable etchants and techniques for removing metals are known, and while they differ per metal, the skilled person will be able to select the right ones. Preferred etchants include acids (Lewis as well as Brønstedt acids). Thus in the case of copper it is preferred to use $FeCl_3$, nitric acid or sulphuric acid. A suitable etchant for removing aluminum is, e.g., NaOH.

It may be desirable, for instance when copper is used as the temporary substrate, to provide the temporary substrate with a non-reducing diffusion barrier layer, e.g., an anti-corrosion layer, more particularly zinc oxide. The anti-diffusion layer can be applied, e.g., by means of electrodeposition, say by Physical Vapour Deposition (PVD) or by Chemical Vapour Deposition (CVD). The anti-diffusion layer generally is removed from the TCO together with the temporary substrate. Alternatively, it is possible to select such a TCO as will prevent such diffusion, e.g., $TiO_2$, $Al_2O_3$, $SnO_2$, or ZnO.

If so desired, the temporary substrate may be provided with a transparent insulation spacer. Because of its transparency, this layer can be left on the TCO to serve as a protective layer for the TCO. The transparent insulation spacer preferably is made of glass. To keep the temporary substrate flexible, and for reasons of economy, the transparent insulation spacer preferably is very thin, e.g., having a thickness of 50-200 nm. Suitable methods of applying such a layer include PECVD (Plasma Enhanced Chemical Vapour Deposition), APCVD (Atmospheric Pressure Chemical Vapour Deposition), and MOCVD (Metal Organic Chemical Vapour Deposition). It is preferred to employ APCVD silicon oxide.

For ease of removal, the temporary substrate preferably is as thin as possible. Of course, it has to be such that other layers can be deposited on it and it has to be able to hold these together, but this generally does not require it to be more than 500 μm (0.5 mm) thick. The thickness preferably is in the range of 1 to 200 μm (0.2 mm). Depending on the modulus of elasticity, the minimum thickness for a large number of materials will be 5 μm. Accordingly, a thickness of 5-150 μm, more particularly of 10-100 μm, is preferred.

The TCO Layer

Examples of suitable transparent conductive oxides are indium tin oxide, zinc oxide, zinc oxide doped with aluminum or boron, cadmium stannate, tin oxide, and, most preferably, F-doped $SnO_2$. Said last-mentioned transparent electrode material is preferred, because it can form a desired crystalline surface with a columnar light scattering texture when applied at a temperature above 400° C., preferably in the range of 500 to 600° C. It is precisely in the case of this TCO material that the use of a temporary substrate capable of withstanding such a high temperature, and particularly the use of a textured metal substrate, is extremely attractive. In addition, the material is resistant to most etchants and has a better resistance to chemicals than the much-used indium tin oxide and than ZnO. Also, it is far less costly. Besides, it is preferred not to employ cadmium compounds.

The TCO can be applied by means of methods known in the field, e.g., by means of Metal Organic Chemical Vapour Deposition (MOCVD), sputtering, Atmospheric Pressure Chemical Vapour Deposition (APCVD), PECVD, spray pyrolysis, evaporation (physical vapour deposition), electrodeposition, screen binding, sol-gel processes, etc. It is preferred to apply the TCO layer at a temperature above 250° C., preferably above 400° C., more preferably between 500 and 600° C., so that a TCO layer of the desired composition, properties and/or texture can be obtained.

The PV Layer

After application of the TCO layer the PV layer can be applied in an appropriate manner. It should be noted here that in the present description the term "PV layer" or "photovoltaic layer" comprises the entire system of layers needed to absorb the light and convert it into electricity. Suitable layer configurations are known, as are the methods for applying them. For the common general knowledge in this field reference may be had to Yukinoro Kuwano, "Photovoltaic Cells," *Ullmann's Encyclopedia*, Vol. A20 (1992), 161 and "Solar Technology," *Ullmann's Encyclopedia*, Vol. A24 (1993), 369.

Various thin film semiconductors can be used in manufacturing the PV layer. Examples are amorphous silicon (a-Si:H), microcrystalline silicon, polycrystalline silicon, amorphous silicon carbide (a-SiC), amorphous silicon-germanium (a-SiGe), and a-SiGe:H. In addition, the PV layer in the solar cell foil according to the invention may comprise CIS (copper indium diselenide, $CuInSe_2$) PV cells, Cu(In, Ga)$(Se,S)_2$ PV cells, CdTe (cadmium telluride) cells and/or dye sensitised and organic PV cells. As is known in the art, combinations of layers of various materials, so-called tandem cells, may also be applied. Suitable combinations include amorphous silicon with microcrystalline silicon, and amorphous silicon with amorphous silicon-germanium.

The PV layer preferably is an amorphous silicon layer when the TCO comprises a fluorine-doped tin oxide. In that case the PV layer will generally comprise a set, or a plurality of sets, of p-doped, intrinsic, and n-doped amorphous silicon layers, with the p-doped layers being situated on the side receiving the incident light.

In the a-Si—H embodiment the PV layer will at least comprise a p-doped amorphous silicon layer (Si-p), an intrinsic amorphous silicon layer (Si-i), and an n-doped amorphous silicon layer (Si-n). It may be that onto the first set of p-i-n layers a second and further p-i-n layers are applied. Also, a plurality of repetitive p-i-n ("pinpinpin" or "pinpinpinpin")layers can be applied consecutively. By stacking a plurality of p-i-n layers, the voltage per cell is raised and the stability of the system is enhanced. Light-induced degradation, the so-called Staebler-Wronski effect, is diminished. Furthermore, the spectral response can be optimised by choosing different band-gap materials in the various layers. This holds notably for the i-layers, and more particularly within the i-layers. The overall thickness of the PV layer, more particularly of all the a-Si layers together, will generally be of the order of 100 to 2,000 nm, more typically about 150 to 600 nm, and preferably about 300 to 500 nm.

The Back Electrode

The back electrode in the solar cell foil according to the invention preferably serves both as reflector and as electrode. Generally, the back electrode will have a thickness of about 50 to 500 nm, and it may comprise any suitable material having light reflecting properties, preferably aluminum, silver, or a combination of layers of both. These metal layers preferably can be applied at a comparatively low temperature, e.g., below 150° C., by means of for instance (in vacuo) physical vapour deposition or sputtering. In the case of silver, it is preferred to first apply an adhesion promoter layer. $TiO_2$ and $ZnO$ are examples of suitable materials for an adhesion promoter layer and have the advantage of also possessing reflecting properties when applied in a suitable thickness, e.g., of about 80 nm.

The Permanent Carrier

Although it is not essential to the process according to the invention, as a rule it is preferred to provide the solar cell foil with a permanent carrier. Otherwise the foil will be so thin that its fragility makes for difficult handling. When employed, the permanent carrier is applied over the back electrode. Suitable carrier layer materials include thin films of polymer, such as polyethylene terephthalate, poly(ethylene 2,6-naphthalene dicarboxylate), polycarbonate, polyvinyl chloride, or thin films of polymer having very good properties such as aramid or polyimide thin films, but also, for example, metal foils onto which an insulating (dielectric) surface layer has been applied, or compositions of epoxy and glass. Polymeric "co-extruded" foils provided with a thermoplastic adhesive layer having a softening point below that of the carrier itself are preferred. Optionally, the co-extruded foil is provided with an anti-diffusion layer of, e.g., polyester (PET), copolyester or aluminum. The thickness of the carrier preferably is 75 µm to 10 mm. Preferred ranges are 100 µm to 6 mm and 150 µm to 300 µm. The flexural rigidity of the carrier, defined within the context of this description as the product of the modulus of elasticity E in $N/mm^2$ and the thickness t to the power of three in mm ($E \times t^3$) preferably is higher than $16 \times 10^{-2}$ Nmm and will generally be lower than $15 \times 10^6$ Nmm.

The carrier may comprise a structure as required for its final use. Thus the carrier may comprise tiles, roofing sheets, car and caravan roofs, etc. In general, however, preference is given to the carrier being flexible. In that case a roll of solar cell foil is obtained which is ready for use and where sheets of the desired power and voltage can be cut off the roll. These can then be incorporated into (hybrid) roof elements or be applied onto tiles, roofing sheets, car and caravan roofs, etc., as desired.

If so desired, an encapsulant may be provided on the TCO side of the solar cell to protect the TCO from outside influences. Generally, the encapsulant will be a polymer sheet (with cavities if so desired) or a polymer film. The encapsulant is required to have a low reflection and a high transmission and may for instance comprise the following materials: amorphous (per)fluorinated polymers, polycarbonate, poly(methylmethacrylate), or any available clear coats, such as those used in the car industry. If so desired, an additional anti-reflection or anti-fouling layer may be provided. Alternatively, if so desired, the entire solar-cell may be incorporated into such an encapsulant.

The Insulating Material

In the process according to the invention the groove in the back electrode (5) and the groove in the TCO layer (8) generally are filled with an insulating material. In the case of the groove in the back electrode (5), this can take place simultaneously with the provision of the permanent carrier (7). In the case of the groove in the TCO layer (8), the encapsulant to be optionally applied can optionally be used to fill the groove. In all cases it is also possible to fill the grooves with an insulating material in a separate step. Suitable insulating material has to be sufficiently flexible for application inside a groove. All cross-linked polymers are suitable for use in principle. Suitable materials are known to the skilled person. As will be clear to the skilled person, the material to be selected must be able to withstand the conditions under which the solar cell foil is to be employed, e.g., in terms of UV, moisture, and temperature resistance. Examples of suitable materials are insulating synthetic resins such as polyurethanes, epoxy resins, epoxy amines, polyesters, and acrylates.

Preferred methods of applying the insulating material are screen printing and ink jet techniques. Other suitable methods of applying the insulating material will be obvious to the skilled person. The insulating strips (9) also can be made of said insulating materials and be applied, e.g., by means of ink jet or other printing techniques.

The Conductive Connection

As was stated earlier, the conductive connection (6) which conductively connects the TCO layer with the back electrode can be established in various ways. If it is established by way of first providing a groove and then filling it with a conductive material, suitable conductive materials include coatings of cross-linked polymers, such as the aforementioned ones, to which a conductive filler, such as particles of silver or flocks of nickel, is added. Such coatings are known to the skilled person. The coatings can be applied using well-known methods such as screen printing, printing, or by means of spraying techniques. It is also possible to provide a soldered connection. Alternatively, the conductive connection can be established via flame spraying of metals, e.g., aluminum. The technology of flame spraying is known to the skilled person.

The invention claimed is:

1. Process for manufacturing a solar cell foil provided with solar cells connected in series, which process comprises the following steps:

providing a temporary substrate; followed by applying a transparent conductive oxide (TCO) layer on the temporary substrate; followed by applying a photovoltaic (PV) layer on the TCO layer; followed by applying a back electrode onto the PV layer; followed by
simultaneously or sequentially in any order applying a conductive layer connection which connects the back electrode to the TCO layer, and
providing a groove in the back electrode down to the PV layer; followed by
providing a permanent carrier; followed by
removing the temporary substrate; and followed by
providing a groove from a side of the TCO layer through the TCO layer through the PV layer down to the back electrode.

2. A process according to claim 1 wherein shunt repair is carried out in the back electrode.

3. A process according to claim 1 wherein the PV layer is an amorphous Si layer and the conductive connection is established by fusing the amorphous Si layer and the back electrode.

4. A process according to claim 1 wherein the temporary substrate and the permanent carrier are flexible and the process is carried out as a roll-to-roll process.

5. Process for manufacturing a solar cell foil provided with solar cells connected in series, which process comprises the following steps:
providing a temporary substrate; followed by
applying a transparent conductive oxide (TCO) layer on the temporary substrate; followed by
applying a photovoltaic (PV) layer on the TCO layer; followed by
applying a back electrode onto the PV layer; followed by
providing a groove in the back electrode down to the PV layer; followed by
providing a permanent carrier onto the back electrode; followed by
removing the temporary substrate; followed by
simultaneously or sequentially in any order providing a groove from a side of the TCO through the TCO layer down to the PV layer and applying a conductive connection which connects the back electrode to the TCO layer.

6. A process according to claim 5 wherein the PV layer is an amorphous Si layer and the conductive connection is established by fusing the amorphous Si layer and the back electrode.

7. A process according to claim 5 wherein the temporary substrate is flexible and the process is carried out as a roll-to-roll process.

8. A process according to claim 5 wherein shunt repair is carried out in the back electrode.

9. A process for manufacturing a solar cell foil provided with solar cells connected in series, which process comprises the following steps:
providing a temporary substrate; followed by
applying a transparent conductive oxide (TCO) layer on the temporary substrate; followed by
applying a photovoltaic (PV) layer on the TCO layer; followed by
applying one or two insulating strips onto the PV layer; followed by
applying a back electrode onto the PV layer and the insulating strips; followed by
simultaneously or sequentially in any order providing a groove in the back electrode down to an insulating strip and applying a conductive connection which connects the back electrode to the TCO layer; followed by
providing a permanent carrier onto the back electrode; followed by
removing the temporary substrate; followed by
providing a groove from a side of the TCO through the TCO layer down to the PV layer or the back electrode when one insulating strip is applied, or down to the other insulating strip when two insulating strips are applied.

10. A process according to claim 9 wherein the PV layer is an amorphous Si layer and the conductive connection is established by fusing the amorphous Si layer and the back electrode.

11. A process according to claim 9, wherein the temporary substrate is flexible and the process is carried out as a roll-to-roll process.

12. A process according to claim 9 wherein two insulating strips are applied onto the PV layer.

13. A process according to claim 9 wherein shunt repair is carried out in the back electrode.

14. A process for manufacturing a solar cell foil provided with solar cells connected in series, which process comprises the following steps:
providing a temporary substrate; followed by
applying a transparent conductive oxide (TCO) layer on the temporary substrate; followed by
applying a photovoltaic (PV) layer on the TCO layer; followed by
applying one or two insulating strips onto the PV layer; followed by
applying a back electrode onto the PV layer and the insulating strips; followed by
providing a groove in the back electrode down to an insulating strip; followed by
providing a permanent carrier onto the back electrode; followed by
removing the temporary substrate; followed by
simultaneously or sequentially in any order providing a groove from a side of the TCO through the TCO layer down to the PV layer or the back electrode when one insulating strip is applied, or down to the other insulating strip when two insulating strips are applied and applying a conductive connection which connects the back electrode to the TCO layer.

15. A process according to claim 14 wherein two insulating strips are applied onto the PV layer.

16. A process according to claim 14 wherein the PV layer is an amorphous Si layer and the conductive connection is established by fusing the amorphous Si layer and the back electrode.

17. A process according to claim 14 wherein the temporary substrate and the permanent carrier are flexible and the process is carried out as a roll-to-roll process.

18. A process according to claim 14 wherein shunt repair is carried out in the back electrode.

* * * * *